(12) United States Patent
Hashimoto et al.

(10) Patent No.: US 11,888,470 B2
(45) Date of Patent: Jan. 30, 2024

(54) ELECTRONIC DEVICE

(71) Applicant: Innolux Corporation, Miao-Li County (TW)

(72) Inventors: Kazuyuki Hashimoto, Miao-Li County (TW); Kung-Chen Kuo, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 17/881,552

(22) Filed: Aug. 4, 2022

(65) Prior Publication Data
US 2023/0179202 A1 Jun. 8, 2023

Related U.S. Application Data

(60) Provisional application No. 63/282,188, filed on Nov. 23, 2021.

(51) Int. Cl.
*H03K 17/687* (2006.01)
(52) U.S. Cl.
CPC .................. *H03K 17/6871* (2013.01)
(58) Field of Classification Search
CPC .................................. H03K 17/6871
See application file for complete search history.

(56) References Cited

U.S. PATENT DOCUMENTS

2021/0358414 A1* 11/2021 Yang .................... G09G 3/3233
2022/0416534 A1* 12/2022 Tseng .................... H05B 45/50

FOREIGN PATENT DOCUMENTS

CN          203326113      12/2013
EP            3736800       11/2020

OTHER PUBLICATIONS

"Search Report of Europe Counterpart Application", dated Apr. 21, 2023, p. 1-p. 13.

* cited by examiner

*Primary Examiner* — Metasebia T Retebo
(74) *Attorney, Agent, or Firm* — JCIPRNET

(57) ABSTRACT

An electronic device includes an electronic component, a driving circuit and a circuit. The driving circuit is electrically connected between a node and a first voltage. The electronic component is electrically connected between the node and a second voltage. The circuit is electrically connected between the node and a third voltage. The first voltage is different from the second voltage and the third voltage.

20 Claims, 9 Drawing Sheets

ELECTRONIC DEVICE

CROSS-REFERENCE TO RELATED APPLICATION

This application claims the priority benefits of U.S. provisional application Ser. No. 63/282,188, filed on Nov. 23, 2021. The entirety of the above-mentioned patent application is hereby incorporated by reference herein and made a part of this specification.

BACKGROUND

Technical Field

The disclosure relates a device, particularly, the disclosure relates to an electronic device.

Description of Related Art

In general, the voltage-controlled device may be operated in a limited voltage range, since the programmable voltage source circuit used to drive the voltage-controlled device may have a limited operating range. Moreover, the general electronic device disposed in the voltage-controlled device does not support the forward current test function, so it cannot effectively determine whether the electronic component of the voltage-control device is damaged.

SUMMARY

The electronic device of the disclosure includes a driving circuit, an electronic component and a circuit. The driving circuit is electrically connected between a node and a first voltage. The electronic component is electrically connected between the node and a second voltage. The circuit is electrically connected between the node and a third voltage. The first voltage is different from the second voltage and the third voltage.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
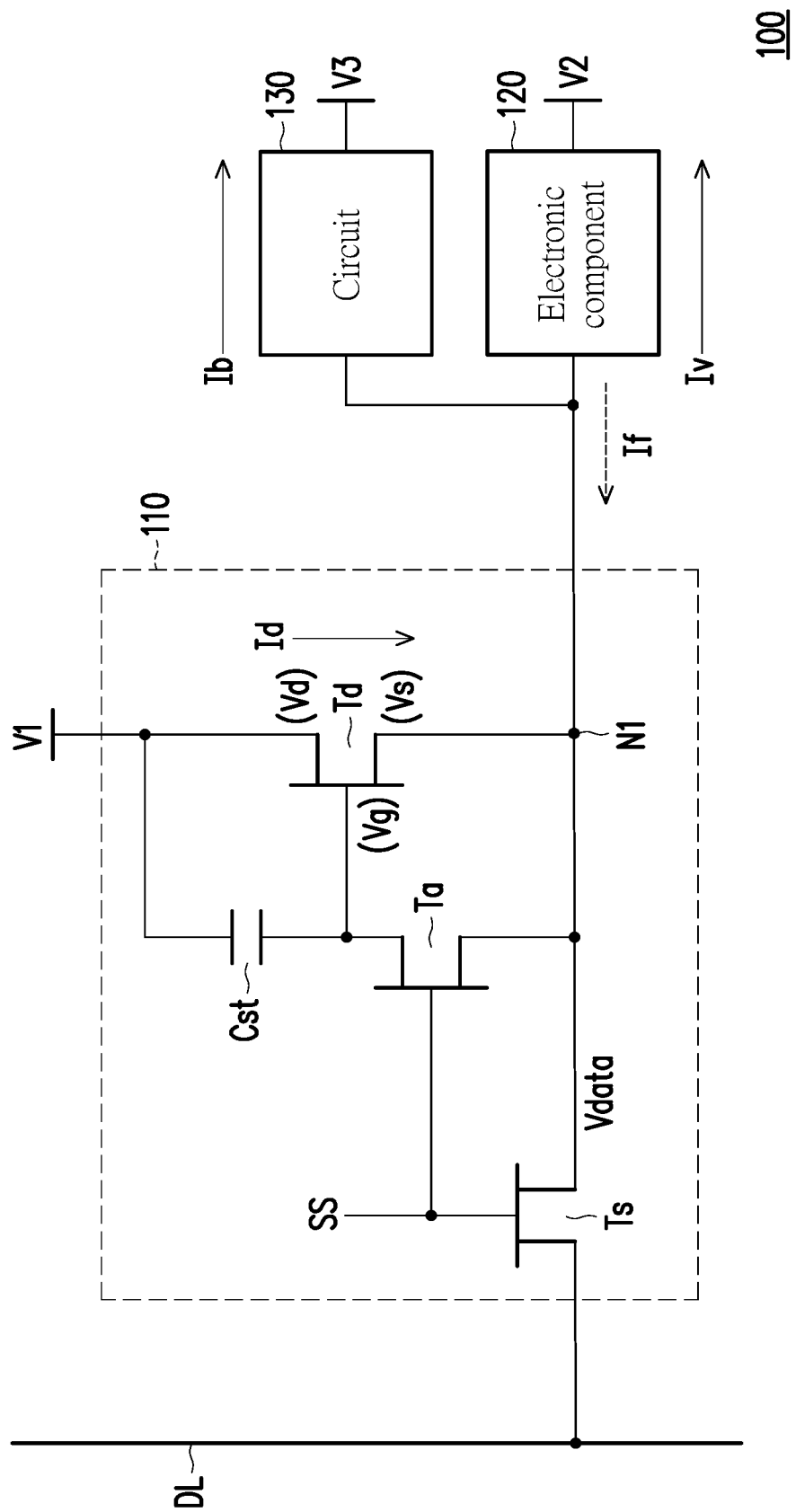
FIG. 1 is a schematic diagram of an electronic device according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like components.

Certain terms are used throughout the specification and appended claims of the disclosure to refer to specific components. Those skilled in the art should understand that electronic device manufacturers may refer to the same components by different names. This article does not intend to distinguish those components with the same function but different names. In the following description and rights request, the words such as "comprise" and "include" are open-ended terms, and should be explained as "including but not limited to . . . ".

The term "electrically connect" used throughout the whole specification of the present application (including the appended claims) may refer to any direct or indirect connection means. For example, if the text describes that a first device is coupled (or connected) to a second device, it should be interpreted that the first device may be directly connected to the second device, or the first device may be indirectly connected through other devices or certain connection means to be connected to the second device. The terms "first", "second", and similar terms mentioned throughout the whole specification of the present application (including the appended claims) are merely used to name discrete elements or to differentiate among different embodiments or ranges. Therefore, the terms should not be regarded as limiting an upper limit or a lower limit of the quantity of the elements and should not be used to limit the arrangement sequence of elements. In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

It should be noted that in the following embodiments, the technical features of several different embodiments may be replaced, recombined, and mixed without departing from the spirit of the disclosure to complete other embodiments. As long as the features of each embodiment do not violate the spirit of the disclosure or conflict with each other, they may be mixed and used together arbitrarily.

The electronic device of the disclosure may include, for example, an antenna pixel circuit, and the electronic component may correspond to a tunable component, such as an antenna unit of one pixel of the antenna pixel. The electronic component of the disclosure may be a voltage-controlled device, and the voltage-controlled device may include, for example, a varactor, a resistor, an inductor or a capacitor. In the embodiment of the disclosure, the circuit coupled to the electronic component of the disclosure may realize a novel bias current circuit for extending the operation range of the programmable voltage source circuit for driving the electronic component such as a source follower amplifier for driving a varactor of antenna application, and supporting the function of the forward current test. In the embodiment of the disclosure, the driving circuit is capable of driving the electronic component, and be operated in, for example, a bias period, a scan period and/or a reset period.

FIG. 1 is a schematic diagram of an electronic device according to an embodiment of the disclosure. Referring to FIG. 1, the electronic device 100 includes a driving circuit 110, an electronic component 120 and a circuit 130. The driving circuit 110 may be electrically connected between a node N1 and a first voltage V1. The electronic component 120 may be electrically connected between the node N1 and a second voltage V2. The circuit 130 may be electrically connected between the node N1 and a third voltage V3. The first voltage V1 is different from the second voltage V2 and the third voltage V3. In other word, the driving circuit 110 may be electrically connected to the electronic component 120 and the circuit 130 through the node N1. The driving circuit 110 may be electrically connected to a data line DL and a first voltage V1. The circuit 130 may be a bias current circuit.

In the embodiment of the disclosure, the driving circuit 110 includes a first scan transistor Ts, a second scan transistor Ta, a first drive transistor Td and a storage capacitor Cst. The first scan transistor Ts is electrically connected to the data line DL and the node N1. For example, a first terminal of the first scan transistor Ts is electrically connected to the data line DL, a second terminal of the first scan transistor Ts is electrically connected to the node N1. A control terminal of the first scan transistor Ts receives a scan signal SS. The first drive transistor Td may be electrically connected to a capacitor Cst. A control terminal of the first scan transistor Ts may be electrically connected to a scan line and receives a scan signal SS. The second scan transistor Ta may be electrically connected between the first driving transistor Td and a data line DL. The second scan transistor Ta may be electrically connected between the first driving transistor Td and the node N1. A first terminal of the second scan transistor Ta may be electrically connected to the storage capacitor Cst. A second terminal of the second scan transistor Ta may be electrically connected to the circuit node N1 or data line DL for equivalent functionality. A control terminal of the second scan transistor Ta may be electrically connected to a scan line and receives a scan signal SS. A first terminal (drain) of the first drive transistor Td is electrically connected to the first voltage V1. A second terminal (source) of the first drive transistor Td is electrically connected to the node N1. A control terminal (gate) of the first drive transistor Td is electrically connected to the storage capacitor Cst and the first terminal of the second scan transistor Ta. A first terminal of the storage capacitor Cst may be electrically connected to the first voltage V1 or any DC voltage source. A second terminal of the storage capacitor Cst may be electrically connected to the control terminal of the first drive transistor Td and the second scan transistor Ta. The driving circuit 110 is a source follower amplifier circuit comprising a first drive transistor Td electrically connected between the first voltage V1 and the node N1.

In the embodiment of the disclosure, the driving circuit 110 may be a programmable voltage source circuit and may be configured to drive the electronic component 120 according to a data voltage Vdata provided by the data line DL. The circuit 130 may be a bias current circuit, such as a sink current circuit, and configured to provide a bias current Ib transmitted from the circuit node N1 to the third voltage V3. In the embodiment of the disclosure, the first scan transistor Ts, the second scan transistor Ta and the first drive transistor Td may be N-type transistors, such as N-type metal oxide semiconductors (NMOS), but it is not limited.

When the first drive transistor Td is an N-type transistor, and the first voltage V1 is higher than the second voltage V2, and the first voltage V1 is higher than the third voltage V3. The first driving transistor Td is configured to source a current as a source follower amplifier circuit. In other embodiment (not shown), when the first drive transistor Td is a P-type transistor, the first voltage V1 is lower than the second voltage V2, and the first voltage V1 is lower than the third voltage V3. The driving transistor Td is configured to sink a current as a source follower amplifier circuit. During a scan period, the first scan transistor Ts and the second scan transistor Ta are turned-on based on the scan signal SS, and an external driving circuit may provide the data voltage Vdata to the driving circuit 110 through data line DL. The storage capacitor Cst may storage the quantity of electricity corresponding to the data voltage Vdata. Then, during a bias period, the first scan transistor Ts and the second scan transistor Ta are turned-off based on the scan signal SS, and the storage capacitor Cst may provide the voltage (Vdata) to turn-on the first drive transistor Td, so that the second terminal of the first drive transistor Td may provide a drive current Id to the node N1 from the first voltage V1. Moreover, the driving circuit 110 may provide a leakage current Iv to drive the electronic component 120 through the circuit node N1. That is, the leakage current Iv is the drive current Id minus the bias current Ib. If the leakage current Iv is greater than or equal to the lowest limit of the drive current Id minus the bias current Ib, the first drive transistor Td may generate the drive current Id adaptively to compensate a lower leakage current Iv to keep the data voltage Vdata, and the lower leakage current Iv may be compensated by introducing the bias current Ib. Thus, during the bias period, the node N1 may keep with the bias voltage of the electronic component 120 corresponding to the data voltage Vdata minus Vth of the driving transistor Td, and the drive current Id may compensate the leakage current Iv.

Therefore, the electronic device 100 may realize to operate the electronic component 120 based on a stable bias voltage and with a large operating range. The circuit 130 may be electrically connected to output of the driving circuit 110 in addition to the electronic component 120 which is equivalent to increase the leakage current of the electronic component 120 to relax the minimum current requirement for the driver circuit 110. Then, the circuit 130 can contribute to extend the operation range to provide the stable bias voltage for the electronic component 120.

Furthermore, the electronic device 100 may also perform a forward current test operation. In the forward current test operation, the node N1 and the control terminal of the first drive transistor Td may be applied the data voltage Vdata in the scan period, which is equal to the third voltage V3, so that the first drive transistor Td is turned-off.

The circuit may comprises a driving transistor Td' (at least shown in FIG. 3C) electrically connected between the node N1 and the third voltage V3. When the driving transistor Td' is an N-type transistor, and the driving transistor Td' is configured to sink a current as a bias current circuit. When the driving transistor Td' is an N-type transistor, and the third voltage V3 is lower than the second voltage V2, the electronic component performs a forward current test operation. In other word, when the driving transistor Td' is an N-type transistor, the second voltage V2 is higher than the third voltage V3, a forward test current may be formed from the second voltage V2 to the third voltage V3 through the electronic component 120 and the circuit 130. The forward test current may be equal to the bias current Ib. At the same time, a varactor and/or a diode disposed in the electronic component 120 may be sensed by an external test equipment through means of thermal sensing, optical sensing, physical deformation sensing or others, so that it can be confirmed whether the electronic component 120 is damaged. In other embodiments of the disclosure, the first drive transistor Td may be a P-type transistor, such as a P-type metal oxide semiconductor (PMOS). The driving transistor Td may be configured to source a current as a source follower amplifier circuit. The circuit 130 may be configured as a source current circuit. The first voltage V1 is configured to become lower than the second voltage V2, and the first voltage V1 is configured to become lower than the third voltage V3. In this regard, during the bias period, the drive current Id, the leakage current Iv and the bias current Ib may be change to the currents in the opposite direction.

Moreover, in the forward current test operation, the third voltage V3 is configured to become higher than the second voltage V2, and the forward test current may also be change to a current in the opposite direction. The circuit may comprises a driving transistor Td' (at least shown in FIG. 3C) electrically connected between the node N1 and the third voltage V3. When the driving transistor Td' is a P-type transistor, and the driving transistor Td' is configured to source a current as a bias current circuit. When the driving transistor Td' is a P-type transistor, and the third voltage V3 is higher than the second voltage V2. The electronic component 120 may perform a forward current test operation, and a forward test current may be formed from the third voltage V3 to the second voltage V2 through the electronic component 120 and the circuit 130.

Figure 2:
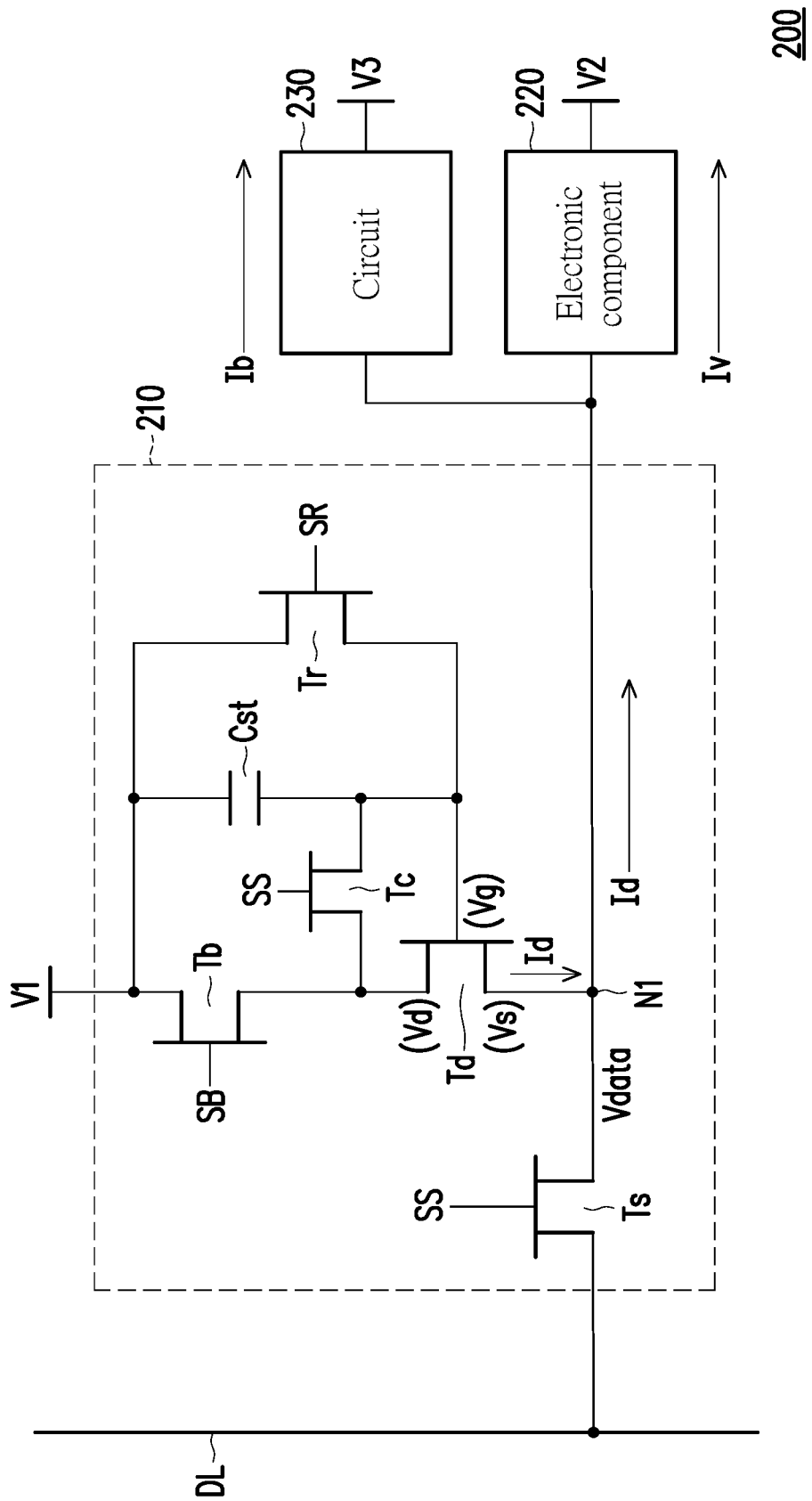
FIG. 2 is a schematic diagram of an electronic device according to an embodiment of the disclosure.

FIG. 2 is a schematic diagram of an electronic device according to an embodiment of the disclosure. Referring to FIG. 2, the electronic device 200 includes a driving circuit 210, an electronic component 220 and a circuit 230. The driving circuit 210 may be electrically connected to the electronic component 220 and the circuit 230 through a node N1, and the driving circuit 210 may be electrically connected to a data line DL and a first voltage V1. The electronic component 220 may be electrically connected between the node N1 and a second voltage V2. The circuit 230 may be electrically connected between the node N1 and a third voltage V3. Different from the embodiment of FIG. 1, the driving circuit 210 may be a source follower amplifier circuit with a voltage (threshold voltage (Vth)) compensation function.

In the embodiment of the disclosure, the driving circuit 210 includes a first scan transistor Ts, a first drive transistor Td, a first compensation transistor Tc, a first bias transistor Tb, a first reset transistor Tr and a storage capacitor Cst. The first reset transistor Tr may be electrically connected between the first voltage V1 and the first drive transistor Td, the first bias transistor Tb may be electrically connected between the first voltage V1 and the first drive transistor Td, and the first compensation transistor Tc may be electrically connected to a drain terminal of the first drive transistor Td and a control terminal of the first drive transistor Td.

For example, a first terminal of the first scan transistor Ts is electrically connected to the data line DL. A second terminal of the first scan transistor Ts is electrically connected to the node N1. A control terminal of the first scan transistor Ts is electrically connected to a scan line and receives a scan signal SS. A first terminal (drain) of the first drive transistor Td is electrically connected to the first compensation transistor Tc and the first bias transistor Tb. A second terminal (source) of the first drive transistor Td is electrically connected to the node N1. A control terminal (gate) of the first drive transistor Td is electrically connected to the first compensation transistor Tc, the storage capacitor Cst and the first reset transistor Tr. A first terminal of the first bias transistor Tb may be electrically connected to the first voltage V1. A second terminal of the first bias transistor Tb may be electrically connected to the first terminal of the first drive transistor Td. A control terminal of the first bias transistor Tb may be electrically connected to a bias line and receives a bias signal SB. A first terminal of the first compensation transistor Tc may be electrically connected to the first terminal of the first drive transistor Td. A second terminal of the first compensation transistor Tc may be electrically connected to the storage capacitor Cst and the control terminal of the first drive transistor Td. A control terminal of the first compensation transistor Tc may be electrically connected to the scan line and receives the scan signal SS. A first terminal of the first reset transistor Tr may be electrically connected to the first voltage V1. A second terminal of the first reset transistor Tr may be electrically connected to the control terminal of the first drive transistor Td. A control terminal of the first reset transistor Tr receives a reset signal SR. A first terminal of the storage capacitor Cst may be electrically connected to the first voltage V1. A second terminal of the storage capacitor Cst may be electrically connected to the control terminal of the first drive transistor Td. The driving circuit may be a source follower amplifier circuit comprising a first drive transistor Td electrically connected between the first voltage V1 and the node N1.

In the embodiment of the disclosure, the driving circuit 210 may be configured to drive the electronic component 220 according to a data voltage Vdata provided by the data line DL. The circuit 230 may be a bias current circuit, such as a sink current circuit, and the circuit 230 may be configured to provide a bias current Ib transmitted from the node N1 to the third voltage V3.

In the embodiment of the disclosure, the first scan transistor Ts, the first drive transistor Td, the first compensation transistor Tc, the first bias transistor Tb and the first reset transistor Tr are N-type transistors, such as NMOS. Specifically, the first voltage V1 is higher than the second voltage V2, and the first voltage V1 is higher than the third voltage V3. During a reset period, the first reset transistor Tr is turned-on based on the reset signal SR, and the voltage of the control terminal of the first drive transistor Td is reset. During a scan period, the first scan transistor Ts and the first compensation transistor Tc are turned-on based on the scan signal SS, and an external driving circuit may provide the data voltage Vdata to the driving circuit 210 through data line DL. The storage capacitor Cst may storage the quantity of electricity corresponding to the data voltage Vdata plus the threshold voltage Vth of the first drive transistor Td. Then, during a bias period, the first bias transistor Tb is turned-on based on the bias signal SB, and the first scan transistor Ts and the first compensation transistor Tc are turned-off based on the scan signal SS, and the storage capacitor Cst may provide the voltage (Vdata+|Vth|) to turn-on the first drive transistor Td, so that the second terminal of the first drive transistor Td may provide a drive current Id to the circuit node N1 from the first voltage V1. Moreover, the driving circuit 210 may provide a leakage current Iv to drive the electronic component 220 through the node N1. That is, the leakage current Iv is the drive current Id minus the bias current Ib. If the leakage current Iv is greater than or equal to the lowest limit of the drive current Id minus the bias current Ib, the first drive transistor Td may generate the drive current Id adaptively to compensate the leakage current Iv to keep the data voltage Vdata, and a lower leakage current Iv may be compensated by introducing the bias current Ib. Thus, during the bias period, the node N1 may keep with the data voltage Vdata, and the drive current Id may compensate the leakage current Iv.

Therefore, the electronic device 200 may realize to operate the electronic component 220 based on a stable bias voltage and with a large operating range. The circuit 230 may be electrically connected to output of the driving circuit 210 in addition to the electronic component 220 which is equivalent to increase the leakage current of the electronic component 220 to relax the minimum current requirement for the driver circuit 210. Then, the circuit 230 can contribute to extend the operation range to provide the stable bias voltage for the electronic component 220.

Furthermore, the electronic device 200 may also perform a forward current test operation. In the forward current test operation, the node N1 may be applied the data voltage Vdata which is equal to the third voltage V3, so that the first drive transistor Td is turned-off. The circuit 230 comprises a driving transistor Td' electrically connected between the node N1 and the third voltage V3. When the driving transistor Td' is an N-type transistor, the third voltage V3 is lower than the second voltage V2, the electronic component 220 performs a forward current test operation. Thus, a forward test current may be formed from the second voltage V2 to the third voltage V3 through the electronic component 220 and the circuit 230. The forward test current may be equal to the bias current Ib. At the same time, a varactor and/or a diode disposed in the electronic component 220 drive by the forward test current may be sensed by an external test equipment through means of thermal sensing, optical sensing, physical deformation sensing or others, so that it can be confirmed whether the electronic component 220 is damaged. The electronic component may include a varactor or a diode.

In other embodiments of the disclosure, the first drive transistor Td may be a P-type transistor, such as PMOS. The first voltage V1 may be configured to become lower than the second voltage V2, and the first voltage V1 may be configured to become lower than the third voltage V3. In this regard, during the bias period, the drive current Id, the leakage current Iv and the bias current Ib may be change to the currents in the opposite direction. Moreover, in the forward current test operation, the third voltage V3 may be configured to become higher than the second voltage V2, and the forward test current may also be change to a current in the opposite direction. In other word, the circuit comprises a driving transistor Td' electrically connected between the node N1 and the third voltage V3, when the driving transistor Td' is a P-type transistor, and the third voltage V3 is higher than the second voltage V2, the electronic component performs a forward current test operation. Thus, a forward test current may be formed from the third voltage V3 to the second voltage V2 through the electronic component 220 and the circuit 230. The forward test current may be equal to the bias current Ib. At the same time, a varactor and/or a diode disposed in the electronic component 220 drive by the forward test current may be sensed by an external test equipment through means of thermal sensing, optical sensing, physical deformation sensing or others, so that it can be confirmed whether the electronic component 220 is damaged.

Figure 3C:
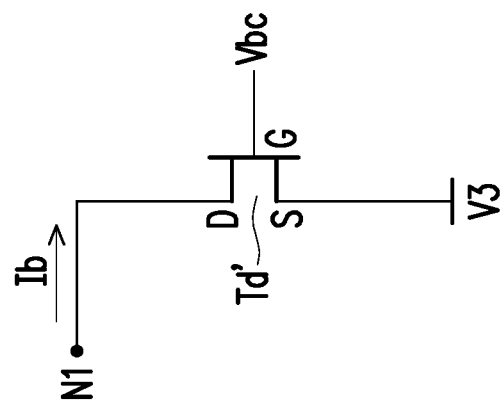
FIG. 3C is a schematic diagram of a circuit according to an embodiment of the disclosure.
Figure 3B:
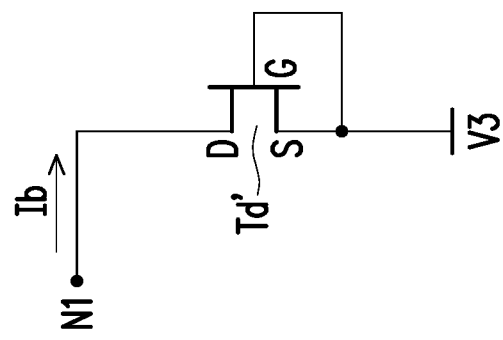
FIG. 3B is a schematic diagram of a circuit according to an embodiment of the disclosure.
Figure 3A:
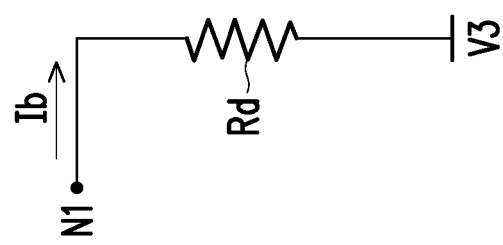
FIG. 3A is a schematic diagram of a circuit according to an embodiment of the disclosure.

FIG. 3A is a schematic diagram of a circuit according to an embodiment of the disclosure. Referring to FIG. 3A, the circuit 130 and the circuit 230 of the embodiments of FIG. 1 and FIG. 2 may include a resistor Rd (shunt resistor) as shown in FIG. 3A. In the embodiments of the disclosure, the resistor Rd may be electrically connected between the node N1 and the third voltage V3. For example, a first terminal of the resistor Rd is electrically connected to the node N1 as shown in FIG. 1 and FIG. 2, and a second terminal of the resistor Rd may be electrically connected to the third voltage V3. The resistor Rd may be configured as bias current circuit for generating the bias current Ib.

FIG. 3B is a schematic diagram of a circuit according to an embodiment of the disclosure. Referring to FIG. 3B, the circuit 130 and the circuit 230 of the embodiments of FIG. 1 and FIG. 2 may include a drive transistor Td' as shown in FIG. 3B. In the embodiments of the disclosure, the circuit 130 may comprise a diode electrically connected between the node N1 and the third voltage V3. For example, a first terminal (drain) of the drive transistor Td' may be electrically connected to the node N1 as shown in FIG. 1 and FIG. 2. A second terminal (source) of the drive transistor Td' may be electrically connected to the third voltage V3. A control terminal (gate) of the drive transistor Td' may be electrically connected to the second terminal (source) of the drive transistor Td'. The drive transistor Td' may be configured as a diode circuit for generating a diode reverse current as the bias current Ib.

FIG. 3C is a schematic diagram of a circuit according to an embodiment of the disclosure. Referring to FIG. 3C, the circuit 130 and the circuit 230 of the embodiments of FIG. 1 and FIG. 2 may include a drive transistor Td' as shown in FIG. 3C. The circuit 230 may comprise a driving transistor Td' electrically connected between the node N1 and the third voltage V3. In the embodiments of the disclosure, a first terminal (drain) of the drive transistor Td' may be electrically connected to the node N1 as shown in FIG. 1 and FIG. 2. A second terminal (source) of the drive transistor Td' may be electrically connected to the third voltage V3. A control terminal (gate) of the drive transistor Td' may be electrically connected to an external voltage line and receives an external voltage Vbc. The drive transistor Td' may be configured as a sink current circuit for generating a sink current as the bias current Ib.

Figure 4:
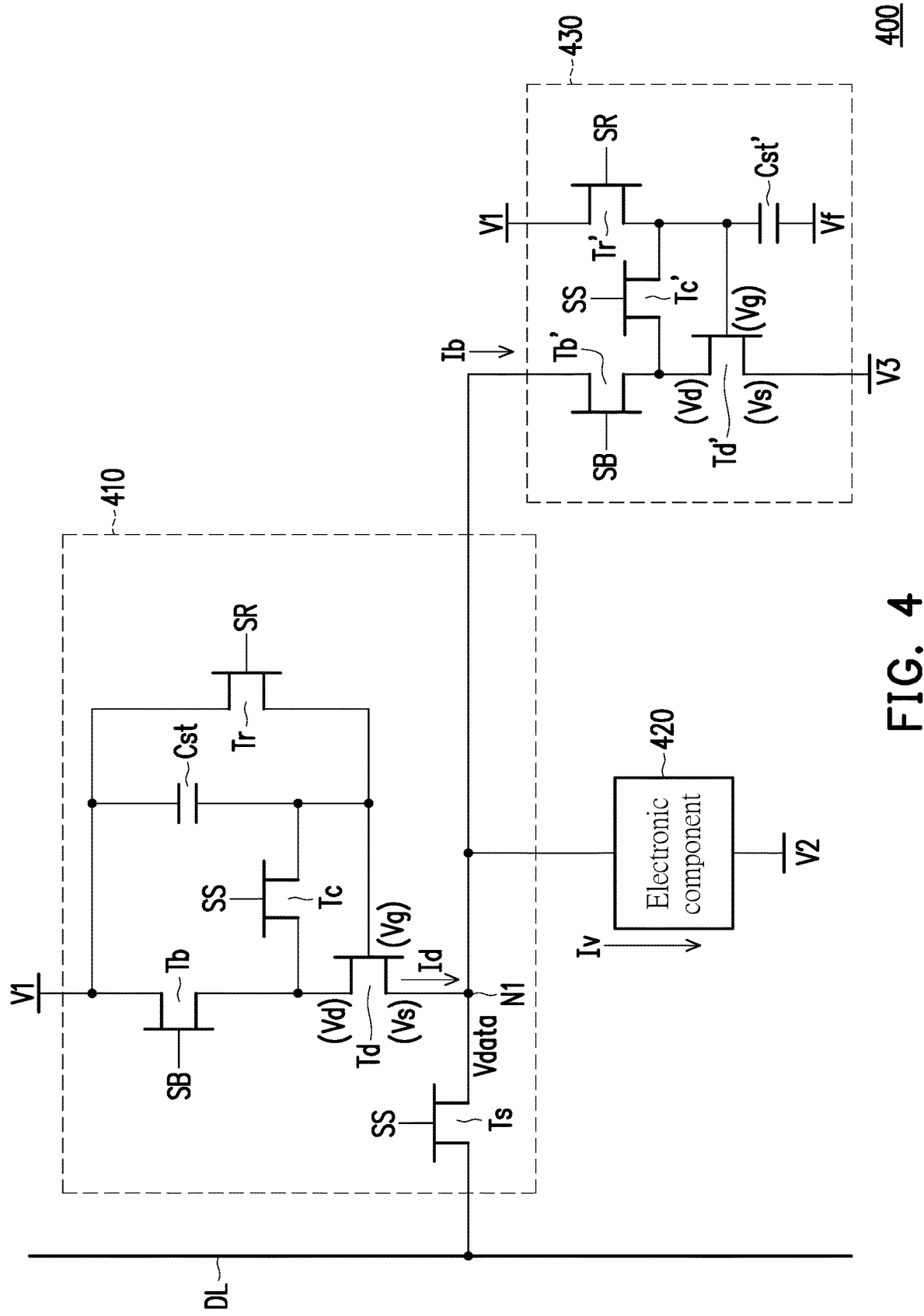
FIG. 4 is a schematic diagram of an electronic device according to an embodiment of the disclosure.

FIG. 4 is a schematic diagram of an electronic device according to an embodiment of the disclosure. Referring to FIG. 4, the electronic device 400 includes a driving circuit 410, an electronic component 420 and a circuit 430. The driving circuit 410 may be electrically connected to the electronic component 420 and the circuit 430 through a node N1, and the driving circuit 410 is electrically connected to a data line DL and a first voltage V1. The electronic component 420 may be electrically connected between the node N1 and a second voltage V2. The circuit 430 may be electrically connected between the node N1 and a third voltage V3.

In the embodiment of the disclosure, the driving circuit 410 includes a first scan transistor Ts, a first drive transistor Td, a first compensation transistor Tc, a first bias transistor Tb, a first reset transistor Tr and a storage capacitor Cst. The driving circuit 410 of the embodiment may refer the description of the embodiment of FIG. 2, and details are not repeated here.

In the embodiment of the disclosure, the circuit 430 includes a drive transistor Td', a compensation transistor Tc', a bias transistor Tb', a reset transistor Tr' and a storage capacitor Cst'. The bias transistor Tb' may be electrically between the node N1 and the driving transistor Td', the compensation transistor Tc' may be electrically to a drain terminal of the driving transistor Td' and a control terminal of the driving transistor Td', the reset transistor Tr' may be electrically connected to the control terminal of the driving transistor Td', and the capacitor Cst' may be electrically to the control terminal of the driving transistor Td'.

For example, a first terminal (drain) of the drive transistor Td' may be electrically connected to the compensation transistor Tc' and the bias transistor Tb'. A second terminal (source) of the drive transistor Td' may be electrically connected to the third voltage V3. A control terminal (gate) of the drive transistor Td' may be electrically connected to the compensation transistor Tc', the storage capacitor Cst' and the reset transistor Tr'. A first terminal of the bias transistor Tb' may be electrically connected to the node N1. A second terminal of the bias transistor Tb' may be electrically connected to the first terminal of the drive transistor Td'. A control terminal of the bias transistor Tb' may be electrically connected to a bias line and receives the bias signal SB. A first terminal of the compensation transistor Tc' is electrically connected to the first terminal of the drive transistor Td'. A second terminal of the compensation transistor Tc' may be electrically connected to the storage capacitor Cst' and the control terminal of the drive transistor Td'. A control terminal of the compensation transistor Tc' may electrically connected to the scan line and receives the scan signal SS. A first terminal of the reset transistor Tr' may be electrically connected to the first voltage V1. A second terminal of the reset transistor Tr' may be electrically connected to the control terminal of the drive transistor Td'. A control terminal of the reset transistor Tr' may be electrically connected to a reset line and receives the reset signal SR. A first terminal of the storage capacitor Cst' may be electrically connected to the control terminal of the drive transistor Td'. A second terminal of the storage capacitor Cst' may be electrically connected to a reference voltage Vf. The circuit 430 may be configured as a sink current circuit.

Figure 5:
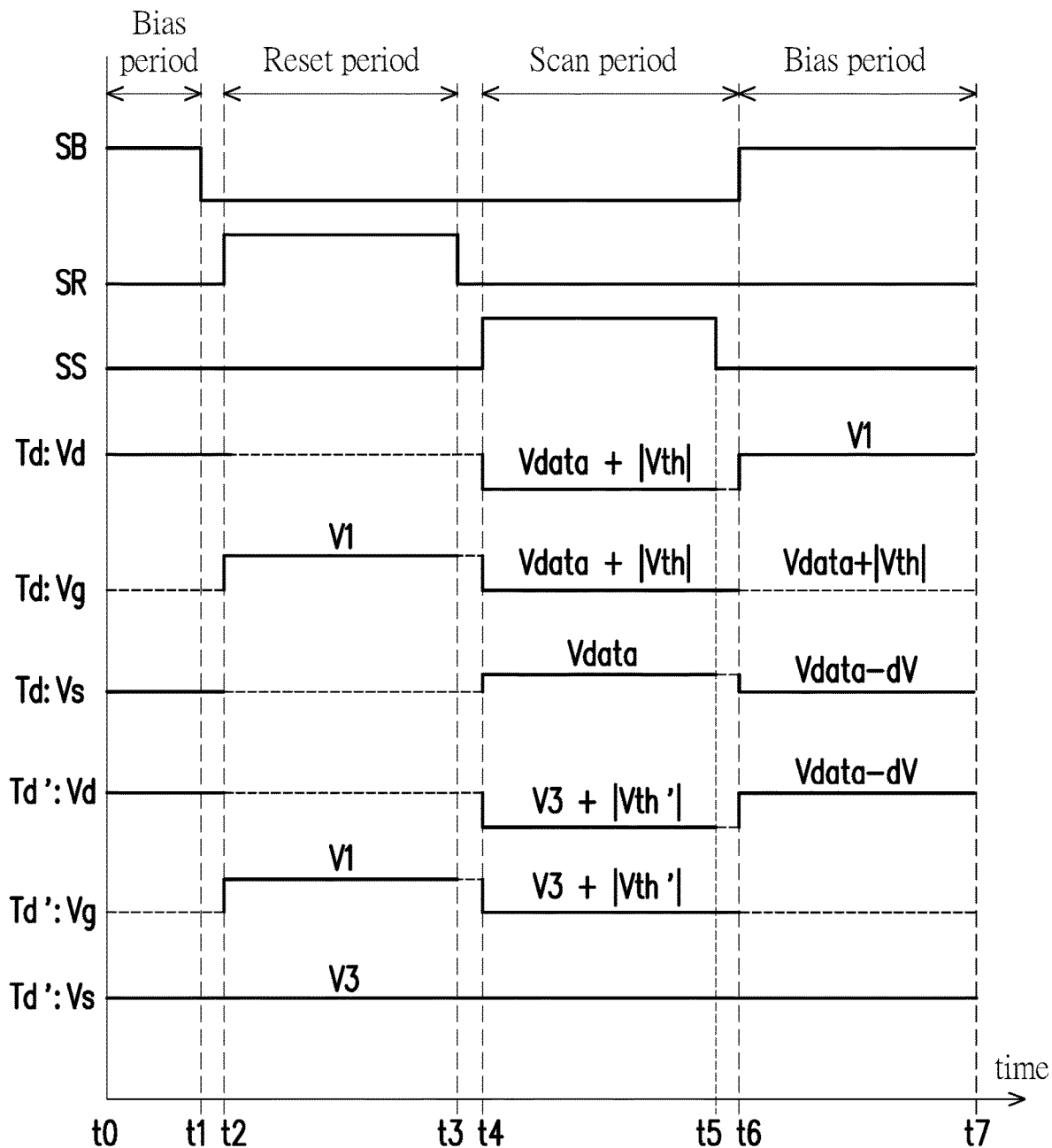
FIG. 5 is a timing diagram of related voltages and signals according to the embodiment of FIG. 4 of the disclosure.

FIG. 5 is a timing diagram of related voltages and signals according to the embodiment of FIG. 4 of the disclosure. Referring to FIG. 4 and FIG. 5, in the embodiment of the disclosure, the driving circuit 410 is configured to drive the electronic component 420 according to a data voltage Vdata provided by the data line DL. The circuit 430 may be configured to provide a bias current Ib transmitted from the circuit node N1 to the third voltage V3. In the embodiment of the disclosure, the first scan transistor Ts, the first drive transistor Td, the first compensation transistor Tc, the first bias transistor Tb and the first reset transistor Tr are N-type transistors, such as NMOS. In the embodiment of the disclosure, when the first drive transistor Td is an N-type transistor, the first voltage V1 is higher than the second voltage V2, and the first voltage V1 is higher than the third voltage V3.

During a reset period from time t2 to time t3, the first reset transistor Tr and the reset transistor Tr' are turned-on based on the reset signal SR with a high voltage level, and the voltages (Td:Vg and Td':Vg) of the control terminal of the first drive transistor Td and the control terminal of the drive transistor Td' are reset. Thus, the voltage (Td:Vg) of the control terminal of the first drive transistor Td is equal to the first voltage V1. The voltage (Td':Vg) of the control terminal of the drive transistor Td' may be equal to the first voltage V1. The voltage (Td':Vs) of the second terminal of the drive transistor Td' may be equal to the third voltage V3.

During a scan period from time t4 to time t5, the first scan transistor Ts, the first compensation transistor Tc and the compensation transistor Tc' are turned-on based on the scan signal SS with a high voltage level, and an external driving circuit may provide the data voltage Vdata to the driving circuit 410 through data line DL. Thus, the voltage (Td:Vs) of the second terminal of the first drive transistor Td may be equal to the data voltage Vdata. The voltages (Td:Vg and Td:Vd) of the control terminal and the first terminal of the first drive transistor Td may be equal to the data voltage Vdata plus the threshold voltage |Vth| of the first drive transistor Td. The voltage (Td':Vs) of the second terminal of the drive transistor Td' may be equal to the third voltage V3. The voltages (Td':Vg and Td':Vd) of the control terminal and the first terminal of the drive transistor Td' may be equal to the third voltage V3 plus a threshold voltage |Vth'| of the drive transistor Td'. The storage capacitor Cst may storage the quantity of electricity corresponding to the data voltage Vdata plus the threshold voltage Vth of the first drive transistor Td. The storage capacitor Cst' may storage the quantity of electricity corresponding to the third voltage V3 plus the threshold voltage Vth' of the drive transistor Td'.

During a bias period from time t6 to time t7 (or time t0 to time t1), the first bias transistor Tb and the first bias transistor Tb' are turned-on based on the bias signal SB with a high voltage level, and the other transistors are turned-off. The storage capacitor Cst may provide the voltage (Vdata+ |Vth|) to turn-on the first drive transistor Td, so that the second terminal of the first drive transistor Td may provide a drive current Id to the node N1 from the first voltage V1. The voltage (Td:Vd) of the first terminal of the first drive transistor Td may be equal to the first voltage V1. The voltage (Td:Vg) of the control terminal of the first drive transistor Td may be equal to the voltage (Vdata+|Vth|). The voltage (Td:Vs) of the second terminal of the first drive transistor Td may be equal to the voltage (Vdata-dV). For example, voltage drop (dV) may be caused by leakage current Iv plus bias current Ib to generate drive current Id for current balance, the first drive transistor Td is turn-on and generates drive current Id. After current balance, the voltage of the node N1 may be equal to the data voltage Vdata minus a voltage drop (dV). Thus, the voltages (Td:Vs and Td':Vd) of the second terminal of the first drive transistor Td and the first terminal of the drive transistor Td' may be equal to the voltage (Vdata-dV).

Moreover, the driving circuit 410 may provide a leakage current Iv to drive the electronic component 420 through the node N1. That is, the leakage current Iv may be the drive current Id minus the bias current Ib. If the leakage current Iv is greater than or equal to the lowest limit of the drive current Id minus the bias current Ib, the first drive transistor Td may generate the drive current Id adaptively to compensate the leakage current Iv to keep the data voltage Vdata, and a lower leakage current Iv may be compensated by introducing the bias current Ib. Thus, during the bias period, the circuit node N1 may keep with the data voltage Vdata, and the drive current Id may compensate the leakage current Iv.

Therefore, the electronic device 400 may realize to operate the electronic component 420 based on a stable bias voltage and with a large operating range. The circuit 430 is electrically connected to output of the driving circuit 410 in addition to the electronic component 420 which is equivalent to increase the leakage current of the electronic component 420 to relax the minimum current requirement for the driver circuit 410. Then, the circuit 430 can contribute to extend the operation range to provide the stable bias voltage for the electronic component 420.

Furthermore, the electronic device 400 may also perform a forward current test operation. In the forward current test operation, the node N1 may be applied the data voltage Vdata which is equal to the third voltage V3, so that the first drive transistor Td is turned off. The second voltage V2 is higher than the third voltage V3. Thus, a forward test current may be formed from the second voltage V2 to the third voltage V3 through the electronic component 420 and the circuit 430. The forward test current may be equal to the bias current Ib. At the same time, a varactor and/or a diode disposed in the electronic component 420 drive by the forward test current may be sensed by an external test equipment through means of thermal sensing, optical sensing, physical deformation sensing or others, so that it can be confirmed whether the electronic component 420 is damaged.

In other embodiments of the disclosure, the first drive transistor Td and the drive transistor Td' may be a P-type transistors, such as PMOS. The circuit 430 may be configured as a source current circuit. When the first drive transistor Td is a P-type transistor, the first voltage V1 may be lower than the second voltage V2, and the first voltage V1 may be lower than the third voltage V3. In this regard, during the bias period, the drive current Id, the leakage current Iv and the bias current Ib may be change to the currents in the opposite direction. Moreover, in the forward current test operation, the third voltage V3 may be configured to become higher than the second voltage V2, and the forward test current may also be change to a current in the opposite direction.

Figure 6:
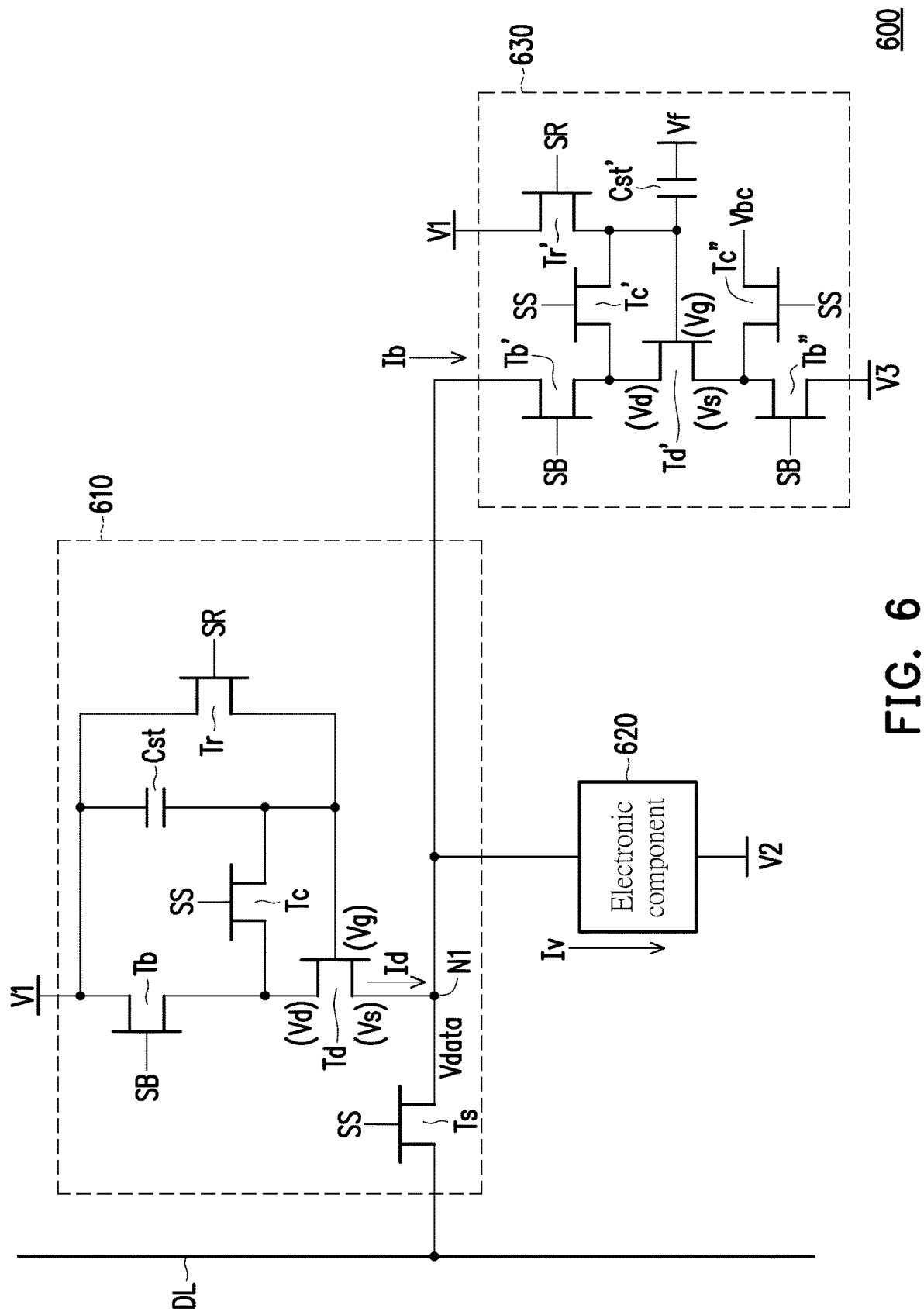
FIG. 6 is a schematic diagram of an electronic device according to an embodiment of the disclosure.

FIG. 6 is a schematic diagram of an electronic device according to an embodiment of the disclosure. Referring to FIG. 6, the electronic device 600 includes a driving circuit 610, an electronic component 620 and a circuit 630. The driving circuit 610 is electrically connected to the electronic component 620 and the circuit 630 through a node N1, and the driving circuit 610 is electrically connected to a data line DL and a first voltage V1. The electronic component 620 may be electrically connected between the node N1 and a second voltage V2. The circuit 630 may be electrically connected between the node N1 and a third voltage V3.

In the embodiment of the disclosure, the driving circuit 610 includes a first scan transistor Ts, a first drive transistor Td, a first compensation transistor Tc, a first bias transistor Tb, a first reset transistor Tr and a storage capacitor Cst. The driving circuit 610 of the embodiment may refer the description of the embodiment of FIG. 2, and details are not repeated here.

In the embodiment of the disclosure, the circuit 630 includes a drive transistor Td', a compensation transistor Tc', a switch transistor Tc", a first bias transistor Tb', a second bias transistor Tb", a reset transistor Tr' and a storage capacitor Cst'.

For example, a first terminal (drain) of the drive transistor Td' may be electrically connected to the compensation transistor Tc' and the first bias transistor Tb'. A second terminal (source) of the drive transistor Td' may be electrically connected to the switch transistor Tc" and the second bias transistor Tb". A control terminal (gate) of the drive transistor Td' may be electrically connected to the compensation transistor Tc', the storage capacitor Cst' and the reset transistor Tr'. A first terminal of the first bias transistor Tb' may be electrically connected to the node N1. A second terminal of the first bias transistor Tb' may be electrically connected to the first terminal of the drive transistor Td'. A control terminal of the first bias transistor Tb' may be electrically connected to a bias line and receives the bias signal SB. A first terminal of the compensation transistor Tc' may be electrically connected to the first terminal of the drive transistor Td'. A second terminal of the compensation transistor Tc' may be electrically connected to the storage capacitor Cst' and the control terminal of the drive transistor Td'. A control terminal of the compensation transistor Tc' may be electrically connected to the scan line and receives the scan signal SS. A first terminal of the reset transistor Tr' may be electrically connected to the first voltage V1. A second terminal of the reset transistor Tr' may be electrically connected to the control terminal of the drive transistor Td'. A control terminal of the reset transistor Tr' may be electrically connected to a rest line and receives the reset signal SR. A first terminal of the storage capacitor Cst' may be electrically connected to the control terminal of the drive transistor Td'. A second terminal of the storage capacitor Cst' may be electrically connected to a reference line and receives a reference voltage Vf. For example, a first terminal of the second bias transistor Tb" may be electrically connected to the second terminal (source) of the drive transistor Td'. A second terminal (source) of the second bias transistor Tb" may be electrically connected to the third voltage V3. A control terminal of the second bias transistor Tb" may be electrically connected to a bias line and receives the bias signal SB. A first terminal of the switch transistor Tc" may be electrically connected to the second terminal (source) of the first drive transistor Td'. A second terminal of the switch transistor Tc" may be electrically connected to an external voltage Vbc. A control terminal of the switch transistor Tc" may be electrically connected to a scan line and receives the scan signal SS. The circuit 630 may be configured as a sink current circuit.

Figure 7:
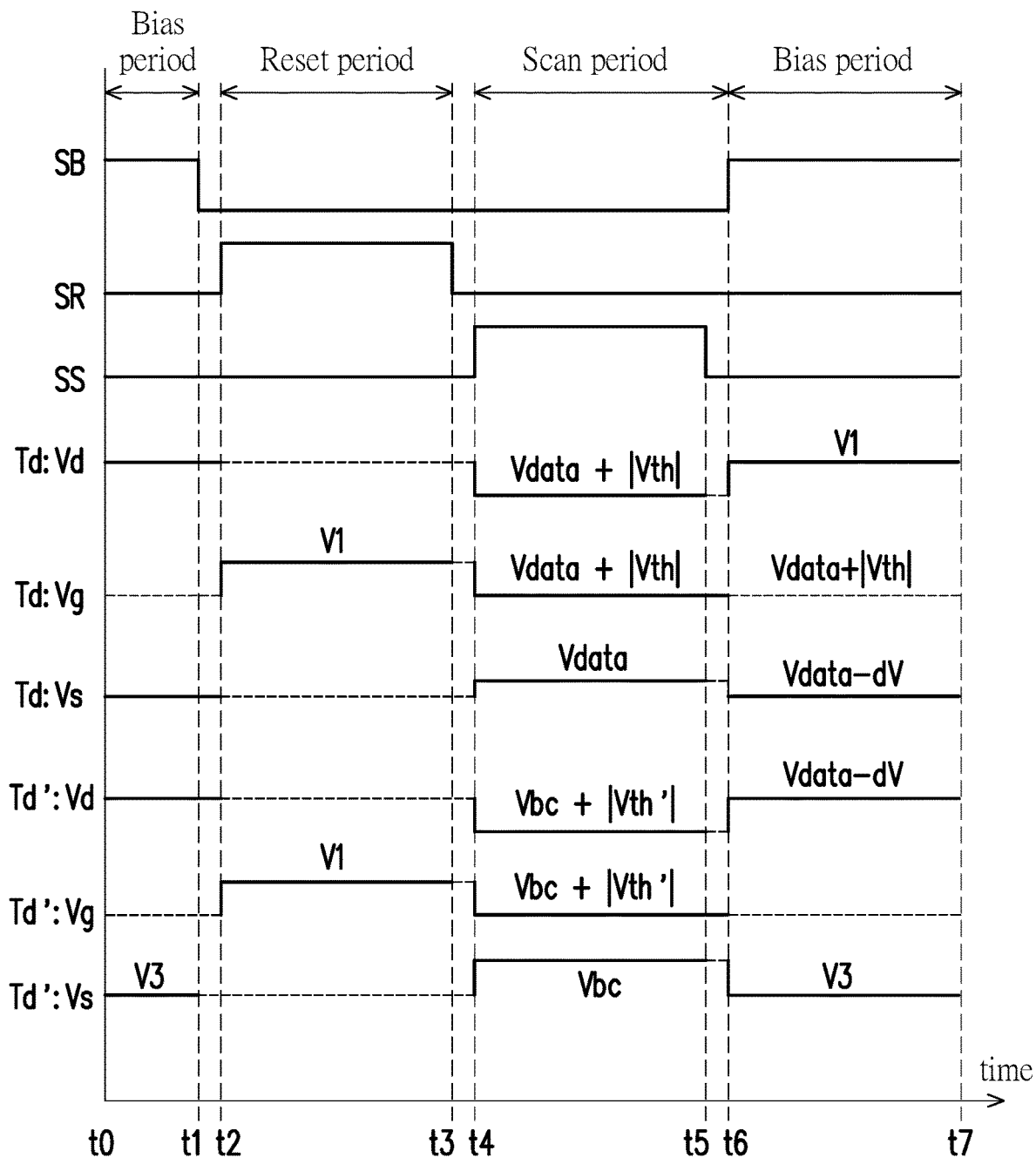
FIG. 7 is a timing diagram of related voltages and signals according to the embodiment of FIG. 6 of the disclosure.

FIG. 7 is a timing diagram of related voltages and signals according to the embodiment of FIG. 6 of the disclosure. Referring to FIG. 6 and FIG. 7, in the embodiment of the disclosure, the driving circuit 610 is configured to drive the electronic component 620 according to a data voltage Vdata provided by the data line DL. The circuit 630 may be configured to provide a bias current Ib transmitted from the node N1 to the third voltage V3. In the embodiment of the disclosure, the first scan transistor Ts, the first drive transistor Td, the first compensation transistor Tc, the first bias transistor Tb and the first reset transistor Tr are N-type transistors, such as NMOS. The drive transistor Td', the compensation transistor Tc', the compensation transistor Tc", the bias transistor Tb', the bias transistor Tb" and the reset transistor Tr' may be N-type transistors, such as NMOS, but it is not limited. In the embodiment of the disclosure, when the first drive transistor Td is an N-type transistor, the first voltage V1 is higher than the second voltage V2, and the first voltage V1 is higher than the third voltage V3.

During a reset period from time t2 to time t3, the first reset transistor Tr and the reset transistor Tr' are turned-on based on the reset signal SR with a high voltage level, and the voltages (Td:Vg and Td':Vg) of the control terminal of the first drive transistor Td and the control terminal of the drive transistor Td' are reset. Thus, the voltage (Td:Vg) of the control terminal of the first drive transistor Td may be equal to the first voltage V1. The voltage (Td':Vg) of the control terminal of the first drive transistor Td' may be equal to the first voltage V1.

During a scan period from time t4 to time t5, the first scan transistor Ts, the first compensation transistor Tc, the compensation transistor Tc' and the compensation transistor Tc" are turned-on based on the scan signal SS with a high voltage level, and an external driving circuit may provide the data voltage Vdata to the driving circuit 610 through data line DL. Thus, the voltage (Td:Vs) of the second terminal of the first drive transistor Td may be equal to the data voltage Vdata. The voltages (Td:Vg and Td:Vd) of the control terminal and the first terminal of the first drive transistor Td may be equal to the data voltage Vdata plus the threshold voltage |Vth| of the first drive transistor Td. The voltage (Td':Vs) of the second terminal of the drive transistor Td' may be equal to the external voltage Vbc. The voltages (Td':Vg and Td':Vd) of the control terminal and the first terminal of the first drive transistor Td' may be equal to the external voltage Vbc plus the threshold voltage Vth' of the drive transistor Td'. The storage capacitor Cst may storage the quantity of electricity corresponding to the data voltage Vdata plus the threshold voltage Vth of the first drive transistor Td. The storage capacitor Cst' may storage the quantity of electricity corresponding to the external voltage Vbc plus the threshold voltage Vth' of the first drive transistor Td'.

During a bias period from time t6 to time t7 (or time t0 to time t1), the first bias transistor Tb, the bias transistor Tb' and the bias transistor Tb" are turned-on based on the bias signal SB with a high voltage level, and the other transistors are turned-off. The storage capacitor Cst may provide the voltage (Vdata+|Vth|) to turn-on the first drive transistor Td, so that the second terminal of the first drive transistor Td may generate a drive current Id to the node N1 from the first voltage V1. The voltage (Td:Vd) of the first terminal of the first drive transistor Td may be equal to the first voltage V1. The voltage (Td:Vg) of the control terminal of the first drive transistor Td may be equal to the voltage (Vdata+|Vth|). The storage capacitor Cst' may provide the voltage (Vbc+|Vth'|) to turn-on the drive transistor Td', so that the first terminal of the drive transistor Td' may generate a bias current Ib from the node N1. The voltage (Td:Vs) of the second terminal of the first drive transistor Td may be equal to the voltage (Vdata-dV). For example, voltage drop (dV) may be caused by leakage current Iv plus bias current Ib to generate drive current Id for current balance, the first drive transistor Td is turn-on and generates drive current Id. After current balance, the voltage of the node N1 may be equal to the data voltage Vdata minus a voltage drop (dV). Thus, the voltages (Td:Vs and Td':Vd) of the second terminal of the first drive transistor Td and the first terminal of the drive transistor Td' may be equal to the voltage (Vdata-dV).

Moreover, the driving circuit 610 may provide a leakage current Iv to drive the electronic component 620 through the node N1. That is, the leakage current Iv is the drive current Id minus the bias current Ib. If the leakage current Iv is greater than or equal to the lowest limit of the drive current Id minus the bias current Ib, the first drive transistor Td may generate the drive current Id adaptively to compensate the leakage current Iv to keep the data voltage Vdata, and a lower leakage current Iv may be compensated by introducing the bias current Ib. Thus, during the bias period, the node N1 may keep with the data voltage Vdata, and the drive current Id may compensate the leakage current Iv.

Therefore, the electronic device 600 may realize to operate the electronic component 620 based on a stable bias voltage and with a large operating range. The circuit 630 is electrically connected to output of the driving circuit 610 in addition to the electronic component 620 which is equivalent to increase the leakage current of the electronic component 620 to relax the minimum current requirement for the driving circuit 610. Then, the circuit 630 can contribute to extend the operation range to provide the stable bias voltage for the electronic component 620.

Furthermore, the electronic device 600 may also perform a forward current test operation. In the forward current test operation, the node N1 may be applied the data voltage Vdata which is equal to the third voltage V3, so that the first drive transistor Td is turned off. The second voltage V2 is higher than the third voltage V3. Thus, a forward test current may be formed from the second voltage V2 to the third voltage V3 through the electronic component 620 and the circuit 630. The forward test current may equal to the bias current Ib. At the same time, a varactor and/or a diode disposed in the electronic component 620 drive by the forward test current may be sensed by an external test equipment through means of thermal sensing, optical sensing, physical deformation sensing or others, so that it can be confirmed whether the electronic component 620 is damaged.

In other embodiments of the disclosure, the first drive transistor Td and the drive transistor Td' may be a P-type transistors, such as PMOS. The circuit 630 may be configured as a source current circuit. The first voltage V1 may be configured to become lower than the second voltage V2, and the third voltage V3 may be configured to become higher than the first voltage V1. In this regard, during the bias period, the drive current Id, the leakage current Iv and the bias current Ib may be change to the currents in the opposite direction. Moreover, in the forward current test operation, the third voltage V3 is configured to become higher than the second voltage V2, and the forward test current may also be change to a current in the opposite direction.

Figure 8:
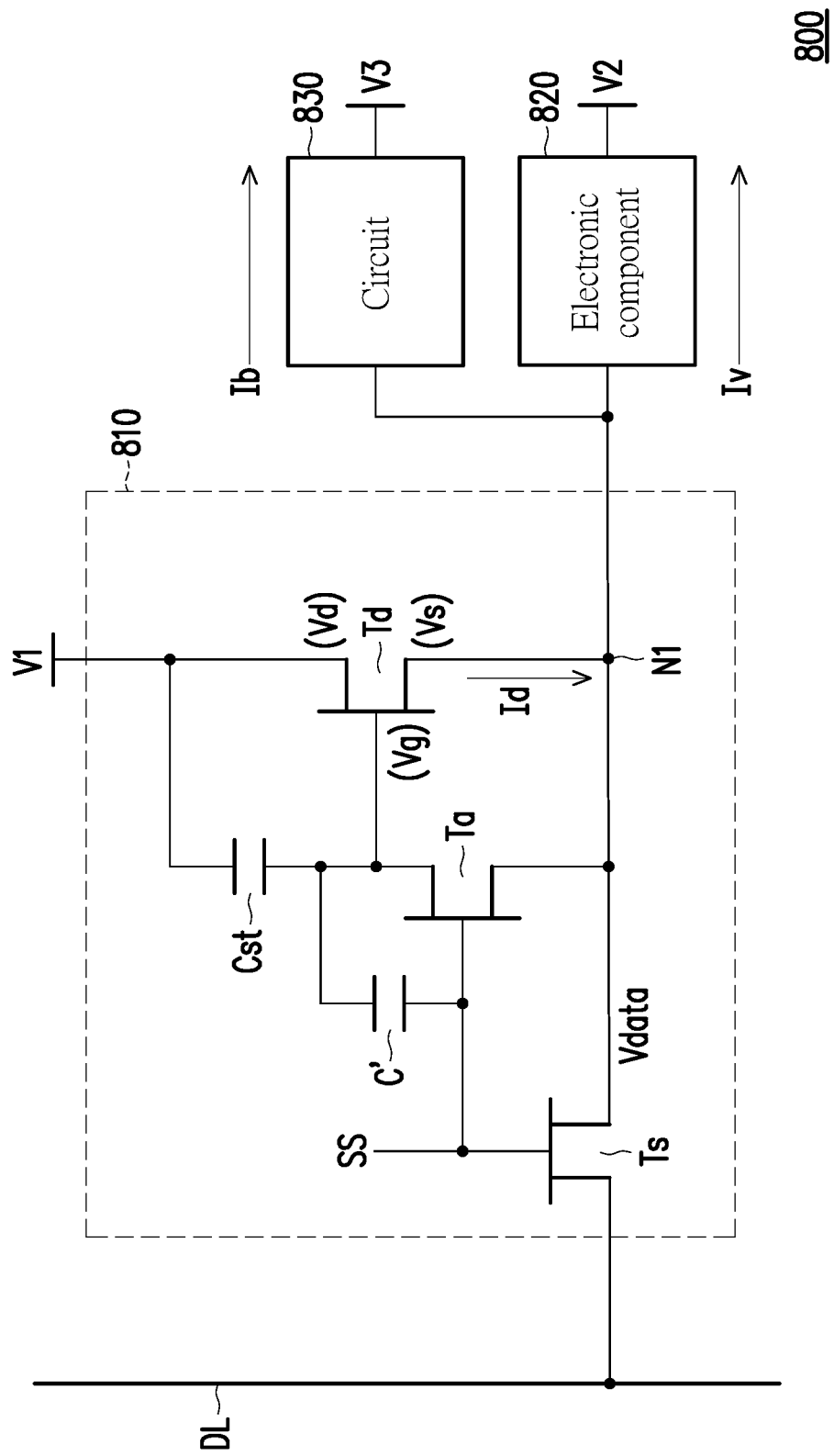
FIG. 8 is a schematic diagram of an electronic device according to an embodiment of the disclosure.

FIG. 8 is a schematic diagram of an electronic device according to an embodiment of the disclosure. Referring to FIG. 8, the electronic device 800 includes a driving circuit 810, an electronic component 820 and a circuit 830. The driving circuit 810 is electrically connected to the electronic component 820 and the circuit 830 through a node N1, and the driving circuit 810 is electrically connected to a data line DL and a first voltage V1. The electronic component 820 may be electrically connected between the circuit node N1 and a second voltage V2. The circuit 830 may be electrically connected between the circuit node N1 and a third voltage V3.

In the embodiment of the disclosure, the driving circuit 810 includes a first scan transistor Ts, a second scan transistor Ta, a first drive transistor Td, a storage capacitor Cst and a capacitor C'. The second scan transistor Ta may be electrically connected between the first driving transistor Td and a data line DL. A first terminal of the first scan transistor Ts may be electrically connected to the data line DL. A second terminal of the first scan transistor Ts may be electrically connected to a node N1. A control terminal of the first scan transistor Ts may be electrically connected to a scan line and receives a scan signal SS. A first terminal of the second scan transistor Ta may be electrically connected to the storage capacitor Cst and the capacitor C'. A second terminal of the second scan transistor Ta may be electrically connected to the node N1. A control terminal of the second scan transistor Ta may be electrically connected to a scan line and receives a scan signal SS. A first terminal (drain) of the first drive transistor Td may be electrically connected to the first voltage V1. A second terminal (source) of the first drive transistor Td may be electrically connected to the node N1. A control terminal (gate) of the first drive transistor Td may be electrically connected to the storage capacitor Cst, the capacitor C' and the first terminal of the second scan transistor Ta. A capacitor (C') may be electrically connected between the first driving transistor Td and a scan line providing a scan signal SS. A first terminal of the capacitor Cst may be electrically connected to the first voltage V1. A second terminal of the capacitor Cst may be electrically connected to the first terminal (drain) of the second scan transistor Ta. A first terminal of the capacitor C' may be electrically connected to the capacitor Cst, a control terminal (gate) of the first drive transistor Td and/or a second scan transistor Ta. A second terminal of the capacitor C' may be electrically connected to the scan line. The first drive transistor Td may be configured as a source follower amplifier circuit.

In the embodiment of the disclosure, the driving circuit 810 may be a programmable voltage source circuit and be configured to drive the electronic component 820 according to a data voltage Vdata provided by the data line DL. The circuit 830 may be a bias current circuit, such as a sink current circuit, and configured to provide a bias current Ib transmitted from the circuit node N1 to the third voltage V3. In the embodiment of the disclosure, the first scan transistor Ts, the second scan transistor Ta and the first drive transistor Td are N-type transistors, such as NMOS. Specifically, the first voltage V1 is higher than the second voltage V2, and the third voltage V3 is lower than the first voltage V1. During a scan period, the first scan transistor Ts and the second scan transistor Ta are turned-on based on the scan signal SS, and an external driving circuit may provide the data voltage Vdata to the driving circuit 810 through data line DL. The storage capacitor Cst may storage the quantity of electricity corresponding to the data voltage Vdata. Then, during a bias period, the first scan transistor Ts and the second scan transistor Ta are turned-off based on the scan signal SS, and the storage capacitor Cst may provide the voltage (Vdata 1) to turn-on the first drive transistor Td, so that the second terminal of the first drive transistor Td may provide a drive current Id to the node N1 from the first voltage V1. Moreover, the driving circuit 810 may provide a leakage current Iv to drive the electronic component 820 through the node N1. That is, the leakage current Iv is the drive current Id minus the bias current Ib. If the leakage current Iv is greater than or equal to the lowest limit of the drive current Id minus the bias current Ib, the first drive transistor Td may generate the drive current Id adaptively to compensate the leakage current Iv to keep the data voltage Vdata. A lower leakage current Iv may be compensated by introducing the bias current Ib. Thus, during the bias period, the circuit node N1 may keep with the data voltage Vdata, and the drive current Id may compensate the leakage current Iv.

It should be noted that, during the bias period, when the first drive transistor Td is operated in a depletion mode, a capacitive coupling effect of the capacitor C' may be effective to a set lower voltage to the control terminal of the first drive transistor Td. Thus, the current value of the driving current Id can be lowered or even lower. Therefore, the electronic device 800 may realize to operate the electronic component 820 based on a stable bias voltage and with a large operating range. In addition, in some embodiments of the disclosure, the electronic device 800 may not have the circuit 830.

Furthermore, the electronic device 800 may also perform a forward current test operation. In the forward current test operation, the node N1 may be applied the data voltage Vdata which is equal to the third voltage V3, so that the first drive transistor Td is turned-off. The second voltage V2 is higher than the third voltage V3. Thus, a forward test current may be formed from the second voltage V2 to the third voltage V3 through the electronic component 820 and the circuit 830. The forward test current may be equal to the bias current Ib. At the same time, a varactor and/or a diode disposed in the electronic component 820 drive by the forward test current may be sensed by an external test equipment through means of thermal sensing, optical sensing, physical deformation sensing or others, so that it can be confirmed whether the electronic component 820 is damaged.

In other embodiments of the disclosure, the first drive transistor Td may be configured as a P-type transistor, such as PMOS. The circuit 830 may be configured as a source current circuit. The first voltage V1 may be configured to become lower than the second voltage V2, and the third voltage V3 may be configured to become higher than the first voltage V1. In this regard, during the bias period, the drive current Id, the leakage current Iv and the bias current Ib may be change to the currents in the opposite direction. Moreover, in the forward current test operation, the third voltage V3 is configured to become higher than the second voltage V2, and the forward test current may also be change to a current in the opposite direction.

Figure 9:
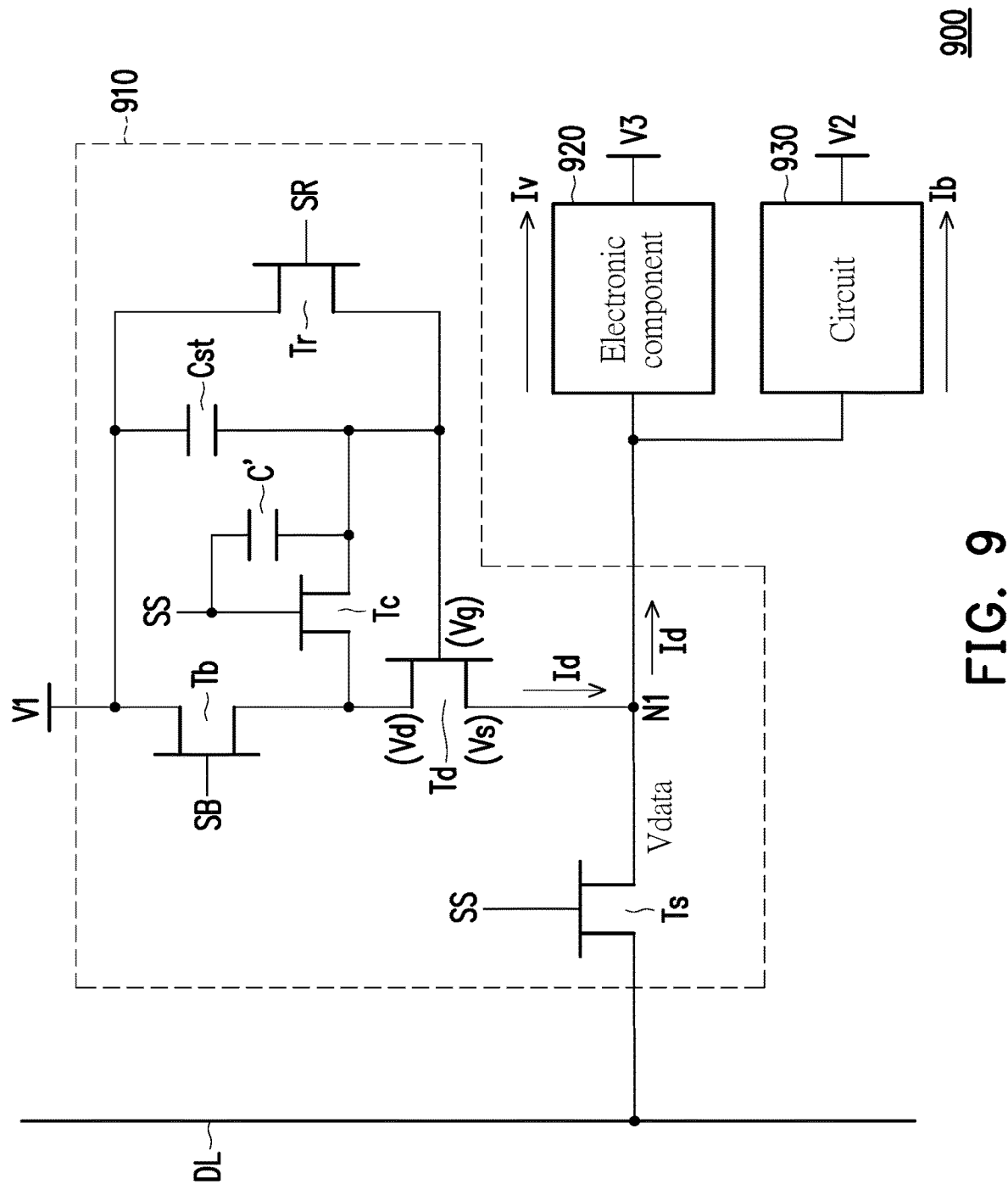
FIG. 9 is a schematic diagram of an electronic device according to an embodiment of the disclosure.

FIG. 9 is a schematic diagram of an electronic device according to an embodiment of the disclosure. Referring to FIG. 9, the electronic device 900 includes a driving circuit 910, an electronic component 920 and a circuit 930. The driving circuit 910 is electrically connected to the electronic component 920 and the circuit 930 through a node N1, and the driving circuit 910 is electrically connected to a data line DL and a first voltage V1. Different from the embodiment of FIG. 8, the driving circuit 910 is a source follower amplifier circuit with voltage (threshold voltage (Vth)) compensation function. The electronic component 920 may be electrically connected between the node N1 and a second voltage V2. The circuit 930 may be electrically connected between the node N1 and a third voltage V3.

In the embodiment of the disclosure, the driving circuit 910 includes a first scan transistor Ts, a first drive transistor Td, a first compensation transistor Tc, a first bias transistor Tb, a first reset transistor Tr, a storage capacitor Cst and a capacitor C'. A first terminal of the first scan transistor Ts may be electrically connected to the data line DL. A second terminal of the first scan transistor Ts may be electrically connected to the node N1. A control terminal of the first scan transistor Ts may be electrically connected to a scan line and receives a scan signal SS. A first terminal (drain) of the first drive transistor Td may be electrically connected to the first compensation transistor Tc and the first bias transistor Tb. A second terminal (source) of the first drive transistor Td may be electrically connected to the node N1. A control terminal (gate) of the first drive transistor Td may be electrically connected to the first compensation transistor Tc, the storage capacitor Cst and the first reset transistor Tr. A first terminal of the first bias transistor Tb may be electrically connected to the first voltage V1. A second terminal of the first bias transistor Tb may be electrically connected to the first terminal of the first drive transistor Td. A control terminal of the first bias transistor Tb may be electrically connected to a bias line and receives a bias signal SB. A first terminal of the first compensation transistor Tc may be electrically connected to the first terminal of the first drive transistor Td. A second terminal of the first compensation transistor Tc may be electrically connected to the storage capacitor Cst, the capacitor C' and/or the control terminal of the first drive transistor Td. A control terminal of the first compensation transistor Tc may be electrically connected to the capacitor C' and a scan line, and receives the scan signal SS. A first terminal of the first reset transistor Tr may be electrically connected to the first voltage V1. A second terminal of the first reset transistor Tr may be electrically connected to the control terminal of the first drive transistor Td. A control terminal of the first reset transistor Tr may be electrically connected to a reset line and receives a reset signal SR. A first terminal of the storage capacitor Cst may be electrically connected to the first voltage V1. A second terminal of the storage capacitor Cst may be electrically connected to the control terminal of the first drive transistor Td. A first terminal of the capacitor C' may be electrically connected to the control terminal of the first compensation transistor Tc. A second terminal of the capacitor C' may be electrically connected to the second terminal of the first compensation transistor Tc. The driver circuit 910 may be configured as a source follower amplifier circuit.

In the embodiment of the disclosure, the driving circuit 910 may be configured to drive the electronic component 920 according to a data voltage Vdata provided by the data line DL. The circuit 930 may be a bias current circuit, such as a sink current circuit, and configured to provide a bias current Ib transmitted from the node N1 to the third voltage V3. In the embodiment of the disclosure, the first scan transistor Ts, the first drive transistor Td, the first compensation transistor Tc, the first bias transistor Tb and the first reset transistor Tr are N-type transistors, such as NMOS. Specifically, the first voltage V1 is higher than the second voltage V2, and the third voltage V3 is lower than the first voltage V1. During a reset period, the first reset transistor Tr is turned-on based on the reset signal SR, and the voltage of the control terminal of the first drive transistor Td is reset. During a scan period, the first scan transistor Ts and the first compensation transistor Tc are turned-on based on the scan signal SS, and an external driving circuit may provide the data voltage Vdata to the driving circuit 910 through data line DL. The storage capacitor Cst may storage the quantity of electricity corresponding to the data voltage Vdata plus the threshold voltage Vth of the first drive transistor Td. Then, during a bias period, the first bias transistor Tb is turned-on based on the bias signal SB, and the first scan transistor Ts and the first compensation transistor Tc are turned-off based on the scan signal SS, and the storage capacitor Cst may provide the voltage (Vdata+|Vth|) to turn-on the first drive transistor Td, so that the second terminal of the first drive transistor Td may provide a drive current Id to the node N1 from the first voltage V1. Moreover, the driving circuit 910 may provide a leakage current Iv to drive the electronic component 920 through the node N1. That is, the leakage current Iv is the drive current Id minus the bias current Ib. If the leakage current Iv is greater than or equal to the lowest limit of the drive current Id minus the bias current Ib, the first drive transistor Td may generate the drive current Id adaptively to compensate the leakage current Iv to keep the data voltage Vdata, and a lower leakage current Iv may be compensated by introducing the bias current Ib. Thus, during the bias period, the node N1 may keep with the data voltage Vdata, and the drive current Id may compensate the leakage current Iv.

It should be noted that, during the bias period, when the first drive transistor Td is operated in a depletion mode, a capacitive coupling effect of the capacitor C' may be effective to a set lower voltage to the control terminal of the drive transistor Td. Thus, the current value of the driving current Id can be lowered or even lower. Therefore, the electronic device 900 may realize to operate the electronic component 920 based on a stable bias voltage and with a large operating range. In addition, in some embodiments of the disclosure, the electronic device 900 may not have the circuit 930.

Furthermore, the electronic device 900 may also perform a forward current test operation. In the forward current test operation, the circuit node N1 may be applied the data voltage Vdata which is equal to the third voltage V3, so that the first drive transistor Td is turned-off. The third voltage V3 is lower than the second voltage V2. Thus, a forward test current may be formed from the second voltage V2 to the third voltage V3 through the electronic component 920 and the circuit 930. The forward test current may be equal to the bias current Ib. At the same time, a varactor and/or a diode disposed in the electronic component 920 drive by the forward test current may be sensed by an external test equipment through means of thermal sensing, optical sensing, physical deformation sensing or others, so that it can be confirmed whether the electronic component 920 is damaged.

In other embodiments of the disclosure, the first drive transistor Td may be configured as a P-type transistor, such as PMOS. The circuit 930 may be configured as a source current circuit. The first voltage V1 may be configured to become lower than the second voltage V2, and the third voltage V3 may be configured to become higher than the first voltage V1. In this regard, during the bias period, the drive current Id, the leakage current Iv and the bias current Ib may be change to the currents in the opposite direction. Moreover, in the forward current test operation, the third voltage V3 is configured to become higher than the second voltage V2, and the forward test current may also be change to a current in the opposite direction.

In summary, the electronic device of the disclosure can operate the electronic component based on the stable bias voltage and with the large operating range. Moreover, the electronic device of the disclosure can also support the forward current test function to effectively determine whether the electronic component in the electronic device is damage.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
   a driving circuit, electrically connected between a node and a first voltage, wherein the driving circuit is a source follower amplifier circuit comprising a first drive transistor electrically connected between the first voltage and the node;
   an electronic component, electrically connected between the node and a second voltage; and
   a circuit, electrically connected between the node and a third voltage,
   wherein the first voltage is different from the second voltage and the third voltage,
   wherein the driving circuit further comprises a first reset transistor, a first bias transistor and a first compensation transistor, the first reset transistor is electrically connected between the first voltage and the first drive transistor, the first bias transistor is electrically connected between the first voltage and the first drive transistor, and the first compensation transistor is electrically connected to a drain terminal of the first drive transistor and a control terminal of the first drive transistor.

2. The electronic device of claim 1, wherein the circuit is a bias current circuit.

3. The electronic device of claim 1, wherein the circuit comprises a resistor electrically connected between the node and the third voltage.

4. The electronic device of claim 1, wherein the circuit comprises a diode electrically connected between the node and the third voltage.

5. The electronic device of claim 1, wherein the driving circuit comprises a first scan transistor electrically connected between a data line and the node, and the first drive transistor is electrically connected to a capacitor.

6. The electronic device of claim 5, wherein the driving circuit comprises a second scan transistor, the second scan transistor is electrically connected between the first driving transistor and a data line.

7. The electronic device of claim 5, wherein the driving circuit comprises a second scan transistor, the second scan transistor is electrically connected between the first driving transistor and the node.

8. The electronic device of claim 1, wherein the driving circuit further comprises a capacitor is electrically connected between the first driving transistor and a scan line.

9. The electronic device of claim 1, wherein when the first drive transistor is an N-type transistor, and the first voltage is higher than the second voltage, and the first voltage is higher than the third voltage.

10. The electronic device of claim 1, wherein when the first drive transistor is a P-type transistor, and the first voltage is lower than the second voltage, and the first voltage is lower than the third voltage.

11. The electronic device of claim 1, wherein the circuit comprises a driving transistor electrically connected between the node and the third voltage.

12. The electronic device of claim 11, wherein when the driving transistor is an N-type transistor, and the driving transistor is configured to sink a current as a bias current circuit.

13. The electronic device of claim 11, wherein when the driving transistor is an N-type transistor, and the third voltage is lower than the second voltage, the electronic component performs a forward current test operation.

14. The electronic device of claim 11, wherein when the driving transistor is a P-type transistor, and the driving transistor is configured to source a current as a bias current circuit.

15. The electronic device of claim 11, wherein when the driving transistor is a P-type transistor, and the third voltage is higher than the second voltage, the electronic component performs a forward current test operation.

16. The electronic device of claim 11, wherein the circuit comprises a reset transistor, a first bias transistor, a compensation transistor and a capacitor, the first bias transistor is electrically between the node and the driving transistor, the compensation transistor is electrically to a drain terminal of the driving transistor and a control terminal of the driving transistor, the reset transistor is electrically connected to the control terminal of the driving transistor, and the capacitor is electrically to the control terminal of the driving transistor.

17. The electronic device of claim 16, wherein the circuit comprises a second bias transistor and a switch transistor, a first terminal of the second bias transistor and a first terminal of switch transistor are electrically connected to a source terminal of the driving transistor, a second terminal of the switch transistor is electrically connected to an external voltage, and a second terminal of the second bias transistor is electrically connected to the third voltage.

18. The electronic device of claim 1, wherein the electronic component includes a varactor.

19. An electronic device, comprising:
a driving circuit, electrically connected between a node and a first voltage;
an electronic component, electrically connected between the node and a second voltage; and
a circuit, comprising a driving transistor electrically connected between the node and a third voltage,
wherein the first voltage is different from the second voltage and the third voltage,
wherein the circuit comprises a reset transistor, a first bias transistor, a compensation transistor and a capacitor, the first bias transistor is electrically between the node and the driving transistor, the compensation transistor is electrically to a drain terminal of the driving transistor and a control terminal of the driving transistor, the reset transistor is electrically connected to the control terminal of the driving transistor, and the capacitor is electrically to the control terminal of the driving transistor.

20. An electronic device, comprising:
a driving circuit, wherein the driving circuit is a source follower amplifier circuit and comprises:
a first drive transistor, electrically connected between a node and a first voltage, wherein the first drive transistor is electrically connected to a capacitor;
a first scan transistor, electrically connected between a data line and the node; and
a second scan transistor, electrically connected between the first driving transistor and the node;
an electronic component, electrically connected between the node and a second voltage; and
a circuit, electrically connected between the node and a third voltage,
wherein the first voltage is different from the second voltage and the third voltage.

* * * * *